United States Patent [19]
Gardner et al.

[11] Patent Number: 6,072,213
[45] Date of Patent: Jun. 6, 2000

[54] TRANSISTOR HAVING AN ETCHANT-SCALABLE CHANNEL LENGTH AND METHOD OF MAKING SAME

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/070,393

[22] Filed: Apr. 30, 1998

[51] Int. Cl.[7] .................................................. H01L 29/76
[52] U.S. Cl. .......................... 257/330; 257/330; 257/635; 257/752; 257/758; 257/776; 438/585
[58] Field of Search .................................. 257/758, 752, 257/776, 330, 635; 438/585

[56] References Cited

U.S. PATENT DOCUMENTS

| | | | |
|---|---|---|---|
| 5,708,303 | 1/1998 | Jeng | 257/758 |
| 5,744,866 | 4/1998 | Horiba | 257/752 |
| 5,793,082 | 8/1998 | Bryant | 257/330 |
| 5,910,684 | 6/1999 | Sandhu | 257/758 |
| 5,929,483 | 7/1999 | Kim et al. | 257/336 |
| 5,949,144 | 9/1999 | Delgado et al. | 257/776 |
| 5,952,702 | 9/1999 | Gardner et al. | 257/408 |

*Primary Examiner*—Mahshid Saadat
*Assistant Examiner*—Edgardo Ortiz
*Attorney, Agent, or Firm*—Kevin L. Daffer; Conley, Rose & Tayon

[57] ABSTRACT

An integrated circuit fabrication process is provided for forming a transistor having an ultra short channel length. First and second masks are formed upon a conductive gate layer, wherein the second mask has a second lateral dimension less than a first lateral dimension of the first mask. The second mask is used to pattern a gate conductor from the conductive gate layer such that the gate conductor has an ultra narrow lateral dimension. Lightly doped drain impurity areas are formed self-aligned to sidewall surfaces of the gate conductor. Spacers are formed laterally adjacent the sidewall surfaces of the gate conductor, and source and drain impurity areas are formed self-aligned to sidewall surfaces of the spacers.

9 Claims, 3 Drawing Sheets

TRANSISTOR HAVING AN ETCHANT-SCALABLE CHANNEL LENGTH AND METHOD OF MAKING SAME

BACKGROUND OF THE INVENTION

1. Field of the Invention

This invention relates to a transistor having a scalable channel length and a method for making the same. By controlling the duration of an etch used to form the gate conductor, transistors having a desired channel length (e.g., less than 0.25 micron) may be accurately fabricated. In addition, the method described herein may be used to reproducibly fabricate a multiplicity of transistors having a desired channel length and to ensure consistency both across a semiconductor substrate and between wafers.

2. Description of the Related Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the $L_{eff}$. Decreasing $L_{eff}$ reduces the distance between the depletion regions associated with the source and drain of a transistor. As a result, less gate charge is required to invert the channel of a transistor having a shorter $L_{eff}$. Accordingly, reducing the physical channel length, and hence the $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemical reaction. The photoresist is washed with a solvent that preferentially removes resist areas of higher solubility. Those exposed portions of the polysilicon material not protected by photoresist are etched away, defining the geometric shape of a polysilicon gate conductor.

The lateral width (i.e., the distance between opposed sidewall surfaces) of the gate conductor, which dictates the physical channel length of a transistor, is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned upon a masking plate may be skewed, enlarged, shortened, or otherwise incorrectly printed onto the photoresist.

In most core logic areas of an integrated circuit there are numerous logic gates, e.g., NAND and NOR gates, and interconnection between those gates. While reducing the $L_{eff}$ of each gate conductor within a logic gate increases the operational frequency and the integration density of an integrated circuit, other factors must also be manipulated to maximize circuit complexity and speed. For example, the spacing between series-connected transistors within a multiple-input logic gate must be decreased to provide for high packing density and high-speed operation of the logic gate. Unfortunately, the minimum definable dimension of lithography mandates the spacing between the gate conductors. The geometric shape of the gate conductors is generally defined by lithographically patterning photoresist over regions of a gate conductor material to be retained for the gate conductors. The minimum distance between portions of the photoresist patterned over the gate conductor material is limited by the constraints of lithography. Therefore, the lateral width of each region of the gate conductor material etched to form the gate conductors cannot be reduced below, e.g., 0.2 micron. As such, the minimum spacing between gate conductors within a logic gate is sacrificed by the conventional procedure of using lithography to pattern the gate conductors.

It would therefore be desirable to develop a transistor fabrication technique in which the channel length of the transistor is reduced to provide for high-frequency operation of an integrated circuit employing the transistor. More specifically, a process is needed in which the channel length is no longer dictated by the resolution of a lithography optical aligner. The lateral width of a gate conductor that defines the channel length of a transistor must no longer be determined by an image printed onto photoresist. Otherwise, the image could be altered during optical lithography, resulting in the dimensions of the gate conductor being altered from design specifications. A process which avoids the limitations of lithographic exposure used for defining opposed sidewall surfaces (i.e., boundaries) of conventional gate conductors would beneficially allow the channel length, and hence the $L_{eff}$, of a transistor to be scaled with higher resolution and potentially to a smaller size. Minimizing and/or providing accurate control over $L_{eff}$ of a transistor would advantageously allow a designer to more closely design for specified operational parameters, such as speed at which the transistor switches between its on and off states.

SUMMARY OF THE INVENTION

The problems outlined above are in large part solved by the technique hereof for fabricating a transistor in which a mask is used to pattern a gate conductor having an ultra short lateral dimension. A gate dielectric material may be formed upon a semiconductor substrate. A conductive gate material may then be formed upon the gate dielectric material. In an embodiment, the conductive gate material may include polycrystalline silicon ("polysilicon") chemical-vapor deposited from, e.g., a silane source. A first masking material may be formed upon the conductive gate material. Preferably, the first masking material exhibits etch characteristics similar to those of the gate dielectric material. For example, an anisotropic etch that selectively removes the first masking material from upon the conductive gate material preferably also will remove the gate dielectric material. A second masking material may then be formed upon the first masking material. Preferably, the second masking material exhibits etch characteristics dissimilar to those of the first masking material.

A photoresist may be deposited upon the second masking material using, e.g., chemical vapor deposition and then selectively patterned and removed from above portions of the second masking material. Portions of the second masking material not masked by the remaining photoresist may be removed using, e.g., an anisotropic dry plasma etch selective for the second masking material to form first masks upon the first masking material. Subsequently, a highly selective isotropic etch may be performed primarily on the first masking material to form second masks, such that a lateral dimension of a second mask is less than a lateral dimension of a first mask formed above the second mask. The isotropic etch technique preferably involves using a wet etchant that exhibits high selectivity for the first masking material such that the first masking material may be etched without significant etching of the overlying first masks.

The first masks may be removed from upon the second masks using an etch technique selective for the first masks. Following removal of the first masks, portions of the conductive gate layer not covered by the second masks may be removed using, e.g., an anisotropic etch selective for the conductive gate material, to form ultra narrow gate conductors. An ion implant may then be forwarded into the semiconductor substrate to form lightly doped drain (LDD) implant regions self-aligned with sidewall surfaces of the gate conductors.

Sidewall spacers may then be formed on the opposed sidewall surfaces of the gate conductors. In an embodiment, a conformal dielectric may be deposited across exposed surfaces of the gate dielectric material, the second masks, and the gate conductors. Preferably, the conformal dielectric material possesses etch properties similar to those of the gate dielectric and the second mask. An anisotropic etch then may be used to preferentially remove the second masks, the conformal dielectric, and portions of the gate dielectric material not masked by the gate conductors from substantially horizontal surfaces of the semiconductor topography while retaining the conformal dielectric on substantially vertical surfaces. The retained material preferably forms spacers laterally adjacent sidewall surfaces of the gate conductors. Following spacer formation, an implant impurity distribution may be forwarded into the semiconductor substrate. The gate conductors preferably serve as implant masks to block implantation of impurity ions into regions of the semiconductor substrate underlying the gates. Heavily doped source and drain implant areas may then be formed in the semiconductor substrate self-aligned with sidewall surfaces of the spacers.

In an alternative embodiment, the second masks and portions of the gate dielectric material not masked by the gate conductors may be removed from the semiconductor topography using, e.g., an anisotropic plasma etch or a wet etch selective for the material to be removed. A conformal dielectric material may then be deposited across exposed portions of the semiconductor substrate and the gate conductors. Spacers may be formed using a selective removal process similar to that described above. Following spacer formation, an implant impurity distribution may be forwarded into the semiconductor substrate. The gate conductors preferably serve as implant masks to block implantation of impurity ions into regions of the semiconductor substrate underlying the gates. Heavily doped source and drain implant areas may then be formed in the semiconductor substrate self-aligned with sidewall surfaces of the spacers.

BRIEF DESCRIPTION OF THE DRAWINGS

Other objects and advantages of the invention will become apparent upon reading the following detailed description and upon reference to the accompanying drawings in which.

Figure 1:
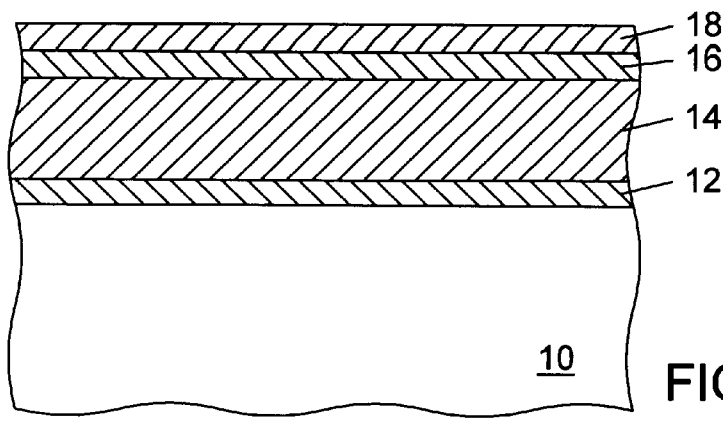
FIG. 1 is a cross-sectional view of a semiconductor topography in which a gate dielectric material, a gate conductive material, a first masking material, and a second masking material are formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, a gate dielectric material is formed upon an upper surface of a semiconductor substrate 10. Semiconductor substrate 10 may be a single crystalline substrate slightly doped with p-type or n-type dopant species. In an embodiment, gate dielectric material 12 may include thermally grown silicon dioxide. Alternatively, gate dielectric material 12 may include a material having a dielectric constant K greater than the K value of silicon dioxide (e.g., tin oxide, tantalum oxide). A conductive gate material may then be formed upon gate dielectric material 12. In an embodiment, conductive gate material 14 may include polycrystalline silicon ("polysilicon") chemical-vapor deposited from, e.g., a silane source. Alternatively, conductive gate material 14 may include other conductive or semiconductive materials, such as tungsten or aluminum.

A first masking material may be formed upon conductive gate material 14. Preferably, first masking material 16 exhibits etch characteristics similar to those of gate dielectric material 12. For example, an anisotropic etch that selectively removes first masking material 16 from upon conductive gate material 14 preferably also will remove gate dielectric material 12. In an embodiment, gate dielectric material 12 and first masking material 16 are both silicon dioxide. A second masking material may then be formed upon the first masking material. Preferably, second masking material 18 exhibits etch characteristics dissimilar to those of first masking material 16. For example, in an embodiment in which first masking material 16 includes silicon dioxide, second masking material 18 may include silicon nitride. In an embodiment in which first masking material 16 includes, e.g., tin oxide or tantalum oxide, second masking material 18 may include silicon dioxide. Second masking material 18, however, may be any material having substantially dissimilar etch characteristics from first masking material 16.

Figure 2:
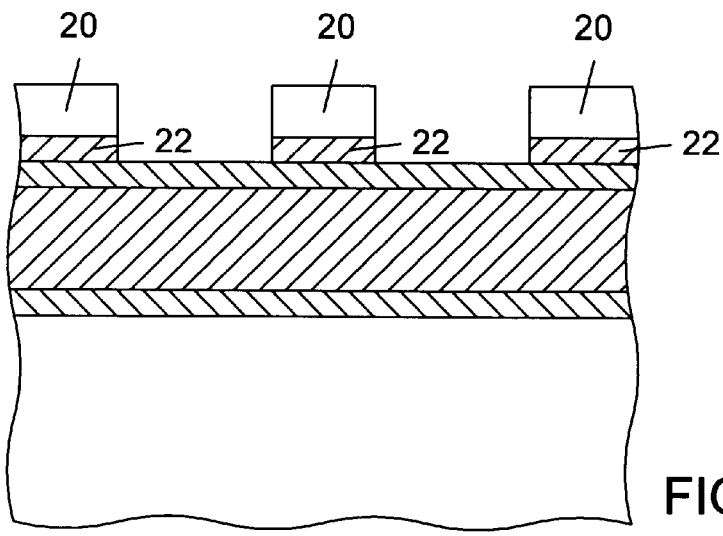
FIG. 2 is a cross-sectional view of the semiconductor topography subsequent to the step in FIG. 1, wherein a photoresist layer is patterned upon the second masking material and the second masking material is selectively etched to form first masks.
Figure 3:
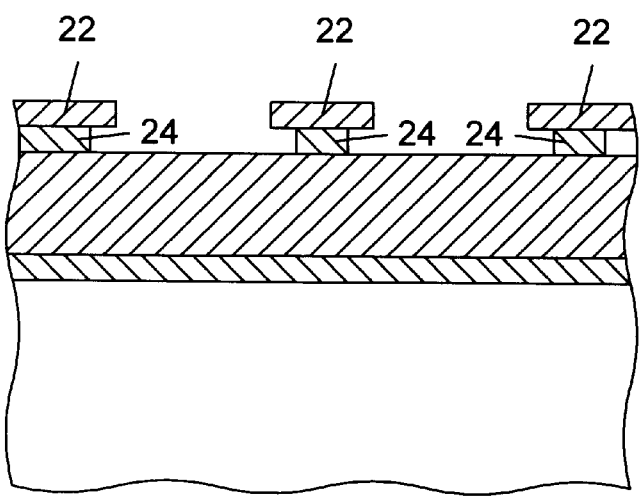
FIG. 3 is a cross-sectional view of the semiconductor topography subsequent to the step in FIG. 2, wherein the first masking material is selectively etched to form second masks.

FIG. 2 illustrates the formation of a photoresist pattern upon the second masking material. Photoresist 20 is deposited using, e.g., chemical vapor deposition and selectively patterned and removed from above portions of the second masking material. Portions of the second masking material not masked by the remaining photoresist may be removed using, e.g., an anisotropic dry plasma etch selective for the second masking material to form first masks 22. Subsequently, an isotropic etch may be performed on the first masking material to form second masks 24 such that a lateral dimension of each of the second masks is substantially less than the lateral dimension of the overlying first mask, as shown in FIG. 3. The isotropic etch technique preferably involves using a wet etchant that exhibits high selectivity for the first masking material such that the first masking material may be etched without significant etching of the overlying first masks 22. In an embodiment in which first masks 22 include silicon nitride and second masks 24 include silicon dioxide, the wet etchant may include hydrogen fluoride.

Figure 4:
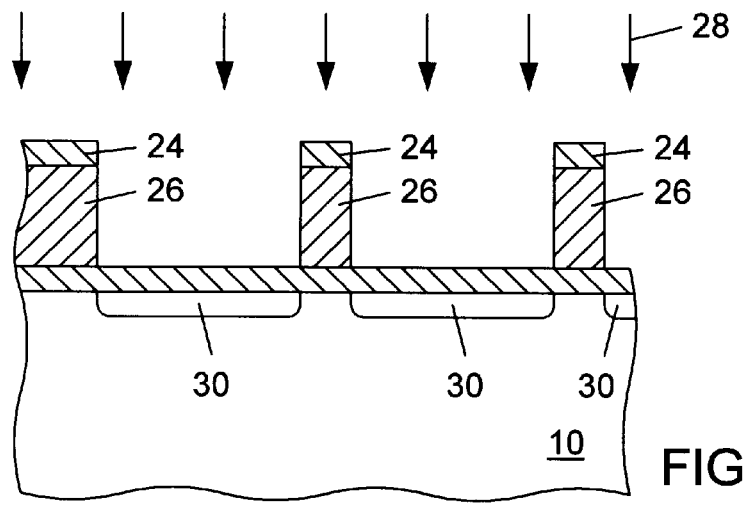
FIG. 4 is a cross-sectional view of the semiconductor topography subsequent to the step in FIG. 3, wherein the first masks are removed, the conductive gate material is selectively removed from regions not covered by the second masks to form gate conductors, and lightly doped drain impurity areas are formed self-aligned to sidewall surfaces of the gate conductors.

Turning now to FIG. 4, the first masks may be removed from upon second masks 24 using an etch technique selective for the first masks. For example, if the first masks include silicon nitride, the first masks may be removed using a wet etch including phosphoric acid; alternatively, an anisotropic plasma etch selective for the first masks may be used. Following removal of the first masks, portions of the conductive gate layer not covered by the second masks may be removed using, e.g., an anisotropic etch selective for the conductive gate material, to form gate conductors 26. Impurity distribution 28 may then be introduced into semiconductor substrate 10 to form lightly doped drain (LDD) impurity areas 30 self-aligned with sidewall surfaces of the gate conductors. In an embodiment, impurity distribution 28 includes dopant ions forwarded into semiconductor substrate 10 using ion implantation.

Figure 5A:
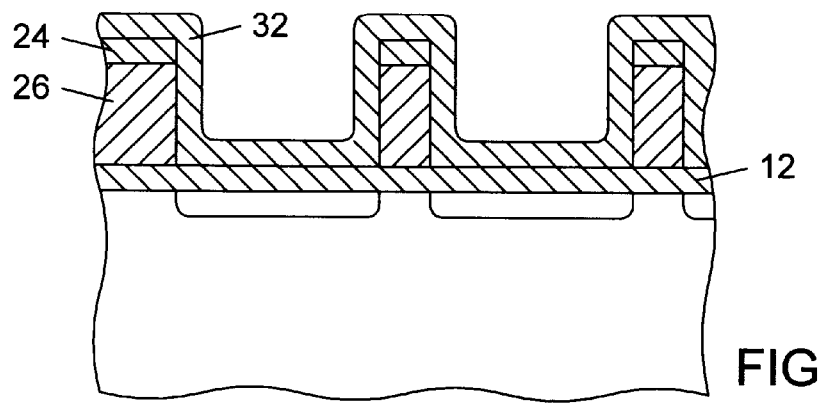
FIG. 5A is a cross-sectional view of the semiconductor topography subsequent to the step in FIG. 4, wherein spacers are formed laterally adjacent sidewall surfaces of the gate conductors.
Figure 5B:
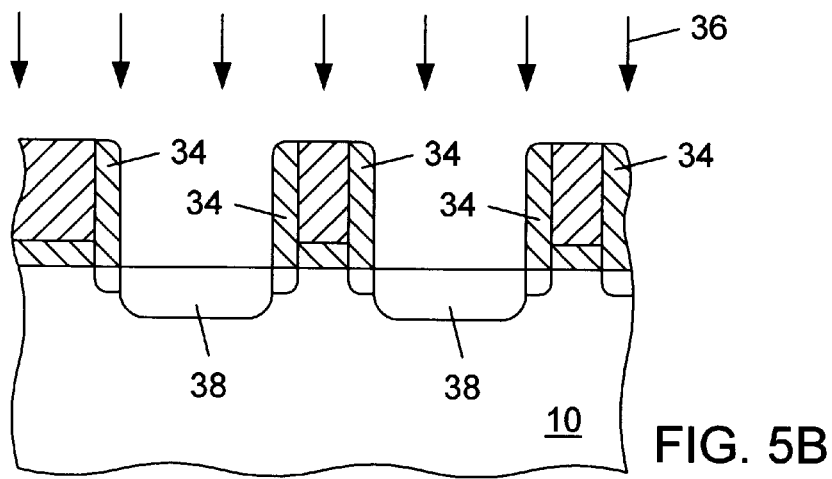
FIG. 5B is a cross-sectional view of the semiconductor topography subsequent to the step in FIG. 5A, wherein source and drain impurity areas are formed self-aligned to sidewall surfaces of the spacers.

Sidewall spacers may then be formed on the opposed sidewall surfaces of gate conductors 26. In an embodiment, conformal dielectric 32 may be deposited across exposed surfaces of gate dielectric material 12, second masks 24, and gate conductors 26, as depicted in FIG. 5A. Preferably, conformal dielectric material 32 possesses etch properties similar to those of the gate dielectric and the second mask. An anisotropic etch then may be used to preferentially remove second masks 24, conformal dielectric 32, and portions of gate dielectric material 12 not masked by gate conductors 26 from substantially horizontal surfaces of the semiconductor topography while retaining the conformal dielectric on substantially vertical surfaces. The retained material preferably forms spacers 34 (FIG. 5B). Following spacer formation, impurity distribution 36 may be forwarded into semiconductor substrate 10. Gate conductors 26 preferably serve as masks to block introduction of impurity ions into regions of the semiconductor substrate underlying the gates. Heavily doped source and drain impurity areas 38 are formed in semiconductor substrate 10 self-aligned with sidewall surfaces of spacers 34.

Following formation of the source and drain impurity areas, a metal silicide layer (not show) may be formed across upper surfaces of gate conductor 26 and source and drain impurity areas 38. A refractory metal (e.g., titanium or cobalt) may be formed across exposed upper surfaces of the semiconductor substrate and the gate conductor. The refractory metal may be sputter deposited from a metal target such that it travels in a direction substantially perpendicular to horizontally oriented features. The deposited refractory metal may be exposed to a form of radiation capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP"). The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of the semiconductor substrate and the gate conductor. Any unreacted refractory metal that remains may be etched away using, e.g., a wet etch highly selective to the metal. The resulting metal silicide has a relatively low resistivity and serves as a self-aligned contact region across the source and drain areas and the gate conductor. Absent refractory metal upon the lower portions of the spacers, no silicide formation occurs at those portions. Consequently, silicide bridging between the gate conductor and the source and drain areas is less likely to occur.

Figure 6A:
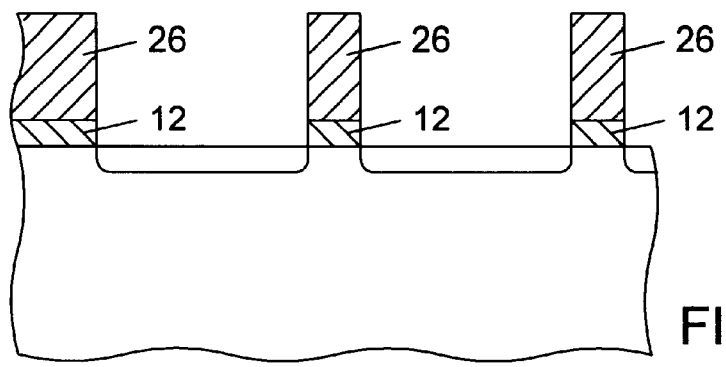
FIG. 6A is a cross-sectional view of the semiconductor topography subsequent to the step in FIG. 4 according to an alternate embodiment, wherein the second masks and portions of the gate dielectric material are removed from the semiconductor topography.
Figure 6B:
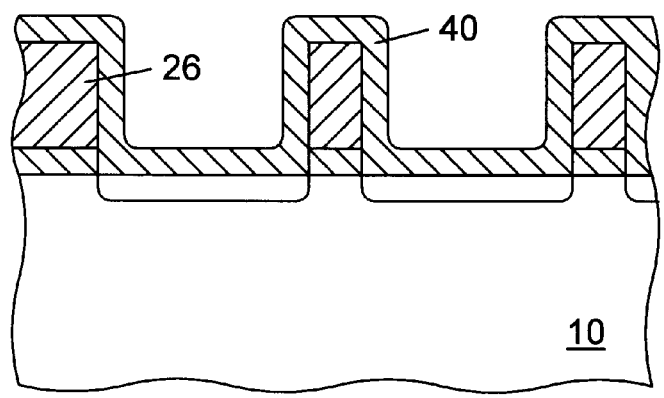
FIG. 6B is a cross-sectional view of the semiconductor topography subsequent to the step in FIG. 6A, wherein spacers are formed laterally adjacent sidewall surfaces of the gate conductors.
Figure 6C:
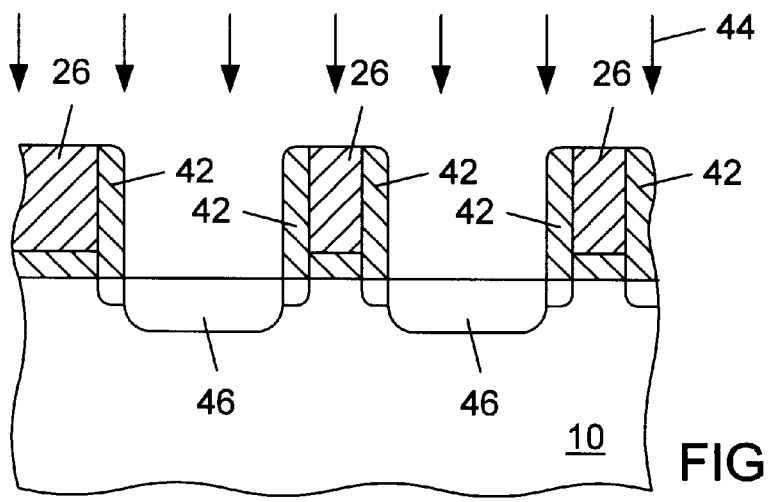
FIG. 6C is a cross-sectional view of the semiconductor topography subsequent to the step in FIG. 6B, wherein source and drain impurity areas are formed self-aligned to sidewall surfaces of the spacers.

In an alternative embodiment, the second masks and portions of gate dielectric material 12 not masked by gate conductors 26 may be removed from the semiconductor topography using, e.g., an anisotropic plasma etch or a wet etch selective for the material to be removed, as depicted in FIG. 6A. Conformal dielectric material 40 may then be deposited across exposed portions of semiconductor substrate 10 and gate conductors 26 (FIG. 6B). Spacers 42 (FIG. 6C) may be formed using a selective removal process similar to that described for spacers 34 above (FIG. 5B). As depicted in FIGS. 6B–6C, conformal dielectric material 40 is the same as the second masks and the gate dielectric material. Alternatively, because spacers 42 are formed after removal of the second masks and portions of gate dielectric material 12, conformal dielectric material 40 may be of different composition than or possess different etch characteristics than the second masks and the gate dielectric material. Following spacer formation, impurity distribution 44 may be introduced into semiconductor substrate 10. In an embodiment, impurity distribution 44 includes dopant ions forwarded into semiconductor substrate 10 by ion implantation. Gate conductors 26 preferably serve as masks to block introduction of impurity ions into regions of the semiconductor substrate underlying the gates. Heavily doped source and drain impurity areas 46 are then formed in semiconductor substrate 10 self-aligned with sidewall surfaces of spacers 42. A refractory metal may be deposited and reacted in a manner similar to that described for the previous embodiment to form a metal silicide upon the gate conductors and the source and drain impurity areas.

It will be appreciated to those skilled in the art having the benefit of this disclosure that this invention is believed to provide a method for forming a transistor having an ultra short channel length. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor topography comprising:

a layer of polysilicon gate material arranged above a semiconductor substrate;

a second mask arranged directly above said layer of polysilicon gate material, said second mask having a width less than the width of said polysilicon gate material such that said second mask is contained within the lateral boundaries of said polysilicon gate material; and, a first mask arranged directly above said second mask wherein said first mask comprises a width greater than the width of said second mask such that said first mask extends beyond the lateral boundaries of said second mask.

2. The semiconductor topography as recited in claim 1, wherein a portion of the layer of polysilicon gate material directly beneath the second mask comprises a gate conductor of a transistor.

3. The semiconductor topography as recited in claim 2, wherein said portion of the layer of polysilicon is configured to accommodate a silicide on an upper surface of said portion and to accommodate spacers on opposed sidewall surfaces of said portion.

4. The semiconductor topography as recited in claim 1, further comprising a gate dielectric interposed between said layer of polysilicon gate material and said semiconductor substrate, and wherein said gate dielectric and said first mask comprise substantially the same material.

5. The semiconductor topography of claim 1, wherein said first mask is contained within the lateral boundaries of said polysilicon gate material.

6. The semiconductor topography of claim 1, wherein said first mask and said second mask comprise substantially different materials.

7. The semiconductor topography of claim 1, wherein said first mask comprises primarily material that allows high etch selectivity relative to said second mask.

8. The semiconductor topography of claim 1, wherein said first mask comprises nitride.

9. The semiconductor topography of claim 8, wherein said second mask comprises oxide.

* * * * *